United States Patent [19]
Chen et al.

[11] Patent Number: 5,989,754
[45] Date of Patent: Nov. 23, 1999

[54] PHOTOMASK ARRANGEMENT PROTECTING RETICLE PATTERNS FROM ELECTROSTATIC DISCHARGE DAMAGE (ESD)

[75] Inventors: Shih-Shiung Chen; Ming-Fa Chen; Ho-Ku Lan; Ying-Chen Chao, all of Hsin-Chu, Taiwan

[73] Assignee: Taiwan Semiconductor Manufacturing Company, Ltd., Taiwan

[21] Appl. No.: 08/923,980

[22] Filed: Sep. 5, 1997

[51] Int. Cl.[6] ................................................ G03F 9/00
[52] U.S. Cl. ............................................................. 430/5
[58] Field of Search .................................................. 430/5

[56] References Cited

U.S. PATENT DOCUMENTS

| | | | |
|---|---|---|---|
| 4,587,184 | 5/1986 | Schneider-Gmelch et al. | 430/5 |
| 5,403,683 | 4/1995 | Ohta et al. | 430/5 |
| 5,798,192 | 8/1998 | King et al. | 430/5 |

*Primary Examiner*—Christopher G. Young
*Attorney, Agent, or Firm*—Pillsbury Madison & Sutro LLP

[57] ABSTRACT

A photomask arrangement is disclosed to prevent the reticle patterns of a photomask from peeling caused by electrostatic discharge damage. The photomask includes: a substrate; a plurality of metal shielding layers formed on the surface of the substrate to provide the reticle patterns, wherein each two of the metal shielding layers are spaced apart by a clear scribe line; and a plurality of metal lines formed on the clear scribe line to connect the adjacent metal shielding layers, thereby increasing the effective surface area of the reticle patterns.

7 Claims, 5 Drawing Sheets

PHOTOMASK ARRANGEMENT PROTECTING RETICLE PATTERNS FROM ELECTROSTATIC DISCHARGE DAMAGE (ESD)

BACKGROUND OF THE INVENTION

1. Field of the Invention

This invention relates in general to a photomask arrangement for preventing reticle patterns from peeling caused by electrostatic discharge damage. More particularly, the invention provides a modified photomask which increases the effective surface area of the reticle patterns by forming a plurality of metal lines on a clear scribe line to connect the adjacent metal shielding layers.

2. Description of Related Art

Photolithography is one of the most important techniques utilized in the manufacture of today's semiconductor integrated circuits. Most semiconductor device structures are defined by this process. In fabricating a transistor, for example, both of the thin film patterns and the impurity diffusion regions are defined by a photolithography process. Therefore, the smallest feature line width that can be achieved by the photolithography process is usually used to determine the capability of a semiconductor plant.

FIG. 1 shows a conventional photolithography process. First, a photosensitive material 12, such as a photoresist layer, is coated on the surface of a silicon wafer 10. A parallel light (indicated by the arrows) then passes through a photomask 14 made of glass or quartz into the photosensitive material 12. An exposor (not shown) is used to provide the parallel light. As is known in the art, the minimum resolution depends on the wavelength of the light source. For example, an I-line (with a wavelength of 3650 Å) stepper normally can provide a minimum resolution of about 0.35 µm.

Next, by using a photochemical reaction of the photosensitive material 12, patterns in the photomask 14 are transferred to the surface of the silicon wafer 10. Usually, the patterns in the photomask 14 are provided by forming a chrome reticle thereon (the shaded area in the drawing). Since the parallel light emitted from an exposor is passed through the photomask 14 into the photosensitive material 12, the photochemical reaction selectively occurs in an area of the photosensitive material 12 not shielded by the chrome reticle. After developing, the photosensitive material 12 has the desired patterns corresponding to those of the photomask 14. The patterned photosensitive material 12 is then used as a mask for defining various structures in the silicon wafer 10.

This is the basic principle of a photolithography process that transfers the patterns of the photomask 14 into the photosensitive material 12. Generally, a so-called positive-type photolithography process is used for fabricating a device having a feature size smaller than 3 µm. That is, the remaining pattern of the photosensitive material 12 is the same as that of the photomask 14.

FIG. 2 is a cross-sectional view schematically illustrating a conventional photomask. As shown in the drawing, the photomask includes a glass (or quartz) 20, a chrome film 22, and a pellicle 28 placed on a base 30 which is fixed by a supporting frame 26. The glass 20 is the body of the photomask. The chrome film 22 is formed on the surface of the glass 20 to provide the reticle pattern. The pellicle 28 is used to segregate particles from the surface of the chrome film 22. Thus, any particles adhering to the photomask will not act as a shield during the photolithography process because they are out of focus. Furthermore, a pod 24 covers the glass 20 of the photomask to prevent it from being stained with particles which generally cause repeating defects on the silicon wafer.

During handling of the photomask, such as during inspecting, cleaning and transporting, the operators may rub the pod 24 with their PVC glove by accident. Static charges are formed on the surface of the pod 24 which, in turn, induce corresponding charges on the surface of the glass 20 and the chrome film 22. Because the chrome film 22 has a small area, the induced charges on the glass 20 and the chrome film 22 form a relative high static potential thereon. Generally, a conventional photomask can sustain a static potential no more than 14 kv/inch. However, the static potential caused by the PVC glove would be greater than 15 kv/inch. This high static potential finally causes electrostatic discharge damage to the reticle pattern, i.e., the chrome film 22 peels.

FIG. 3A illustrates, in top view, the chrome film layout of a conventional photomask. As can be seen in the drawing, there are four spaced-apart chrome films 22a, 22b, 22c, and 22d formed on a photomask. A clear scribe line 32 is formed around these four chrome films 22a, 22b, 22c, and 22d for their isolation. Since each of the chrome films 22a, 22b, 22c, and 22d has a small area and no line is formed therebetween, there is no path to spread the static charges caused by an accidental rub from one chrome film to the other. Thus, the static charges form a relative high static field on the chrome films 22a, 22b, 22c, and 22d, causes electrostatic discharge damage.

Referring to FIG. 3B, a break on the chrome film 22 caused by a high static field is depicted. As shown in the drawing, the break usually appears at a corner 34 of the chrome film 22, i.e., the area where the electrostatic discharge occurs.

Accordingly, several modified photomask designs have been disclosed to overcome the problem of electrostatic discharged damage. One of the modified photomasks is shown in FIG. 4. A gold film 40 having a thickness of about 60 Å is sputtered on the surface of the photomask to connect all of the chrome films 22. However, there are some drawbacks to forming such gold film 40 on the surface of photomask. First, it is not easy to form a gold film 40 with a thickness of only 60 Å using today's process techniques. The yield from fabricating this kind of photomask is poor. Furthermore, the additional step of forming a gold film 40 on the surface of a photomask increases the manufacturing complexity and cost.

Another approach to the problem has been to neutralize the static charges on the chrome film 22 with opposite-type ions generated by an ionizer. The static field can be reduced since the amount of static charge on the chrome film 22 is decreased. Hence, the reticle patterns of photomask can be prevented from incurring electrostatic discharge damage.

FIG. 5 is a chart showing the relationship of the static potential and the ionizer treatment time. As shown in the drawing, the static potential of the chrome film 22 can be reduced from 15 kv/inch to less than 1 kv/inch in 20 minutes. However, the chrome film 22 is damaged before the ionizer treatment since the static potential has increased to more than 14 kv/inch. Therefore, a break caused by the high static potential occurs at the corner of the chrome film 22 as well.

SUMMARY OF THE INVENTION

It is therefore an object of the present invention to provide a special photomask design to prevent the reticle patterns of the photomask from peeling caused by electrostatic discharge damage. A plurality of metal lines are utilized to connect the adjacent metal shielding layers which are spaced apart by a clear scribe line, which increases the effective surface of the metal shielding layers and therefore reduces the damage from electrostatic discharge. The metal lines can either cover a portion of the clear scribe line or the entire area of the clear scribe line. The resultant pattern is not influenced by the metal line since the width of the metal line is less than the minimum resolution of the photolithography process. This design can be applied to every layer with clear scribe lines.

It is another object of the present invention to provide a modified photomask to protect the reticle patterns from electrostatic discharge damage by forming a plurality of metal lines to connect the adjacent metal shielding layers. The formation of the metal lines and the pattern definition of the metal shielding layers are performed concurrently without increasing the processing steps for preparing the photomask.

The present invention achieves the above-identified objects by providing a special photomask design to prevent the reticle patterns of a photomask from peeling caused by electrostatic discharge damage. The modified photomask includes: a substrate; a plurality of metal shielding layers formed on the surface of the substrate to provide the reticle patterns, wherein each two of the metal shielding layers are spaced apart by a clear scribe line; and a plurality of metal lines formed on the clear scribe line to connect the adjacent metal shielding layers, thereby increasing the effective surface area of the reticle patterns.

BRIEF DESCRIPTION OF THE DRAWINGS

Other objects, features and advantages of the present invention will become apparent by way of the following detailed description of the preferred, but non-limiting, embodiment with reference to the following drawings.

DETAILED DESCRIPTION OF THE PREFERRED EMBODIMENTS

Figure 1:
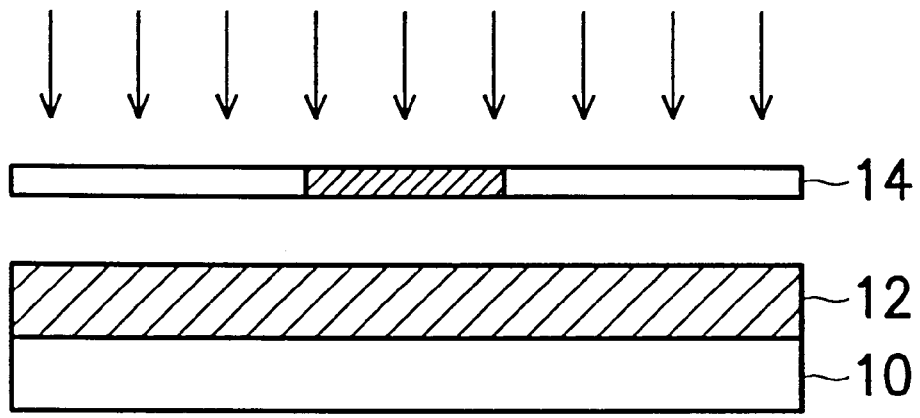
FIG. 1 schematically illustrates a conventional photolithography process.
Figure 2:
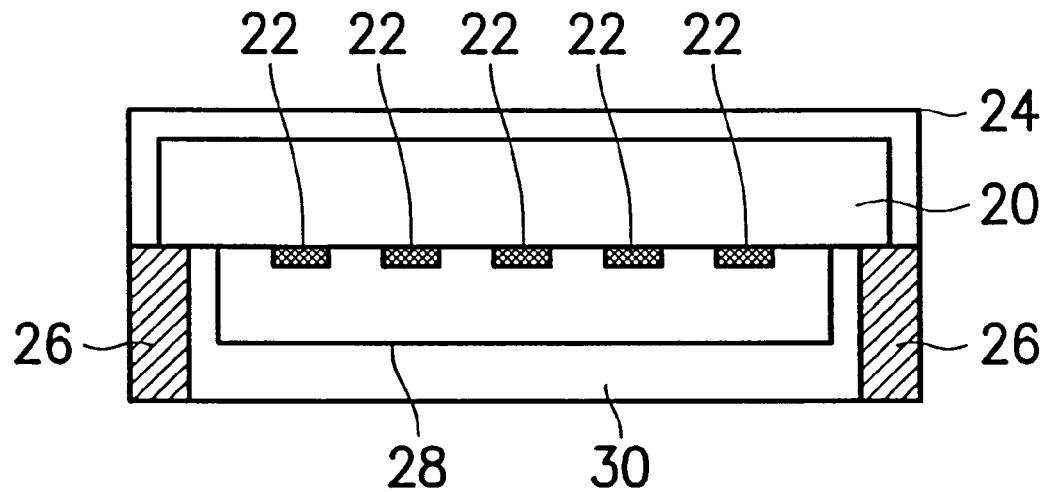
FIG. 2 is a cross-sectional view showing a conventional photomask.
Figure 3A:
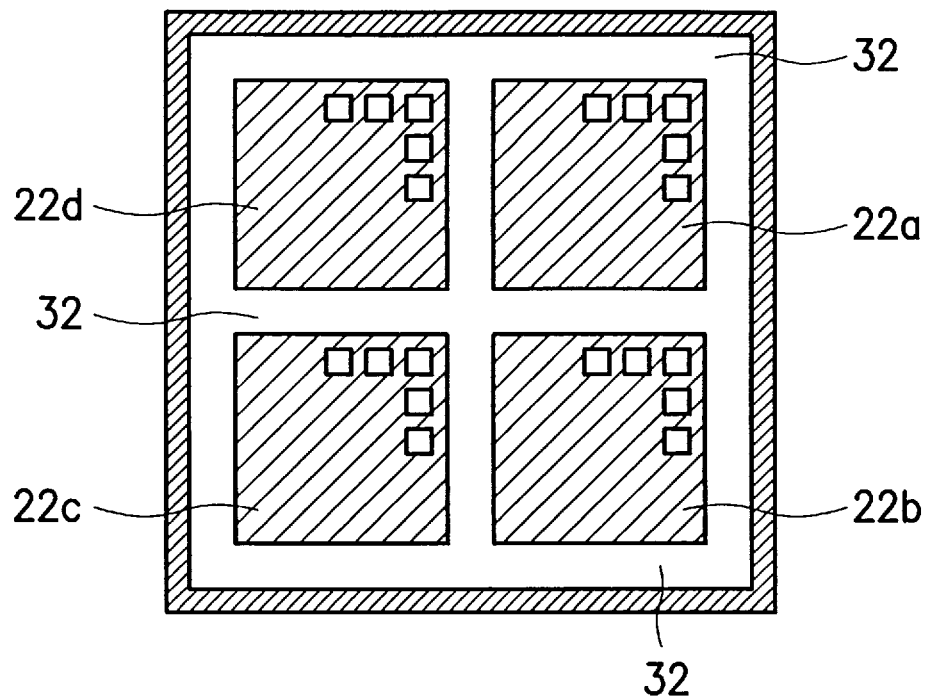
FIG. 3A illustrates, in top view, a chrome film layout of a conventional photomask.
Figure 3B:
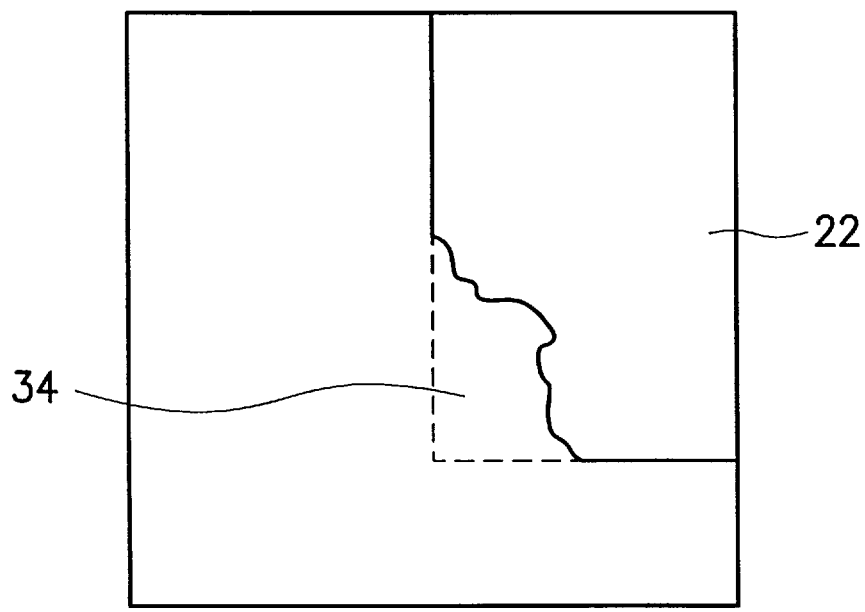
FIG. 3B shows a break on the corner of the chrome film 22 caused by a high static potential.
Figure 4:
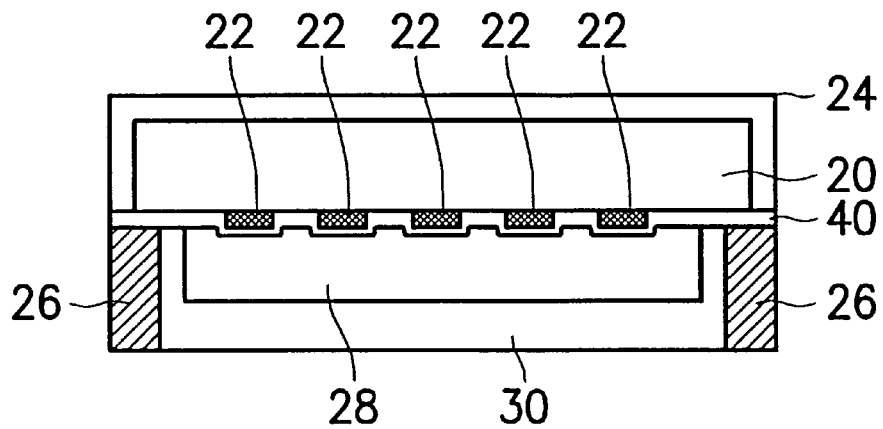
FIG. 4 is a modified photomask having a gold film sputtered thereon.
Figure 5:
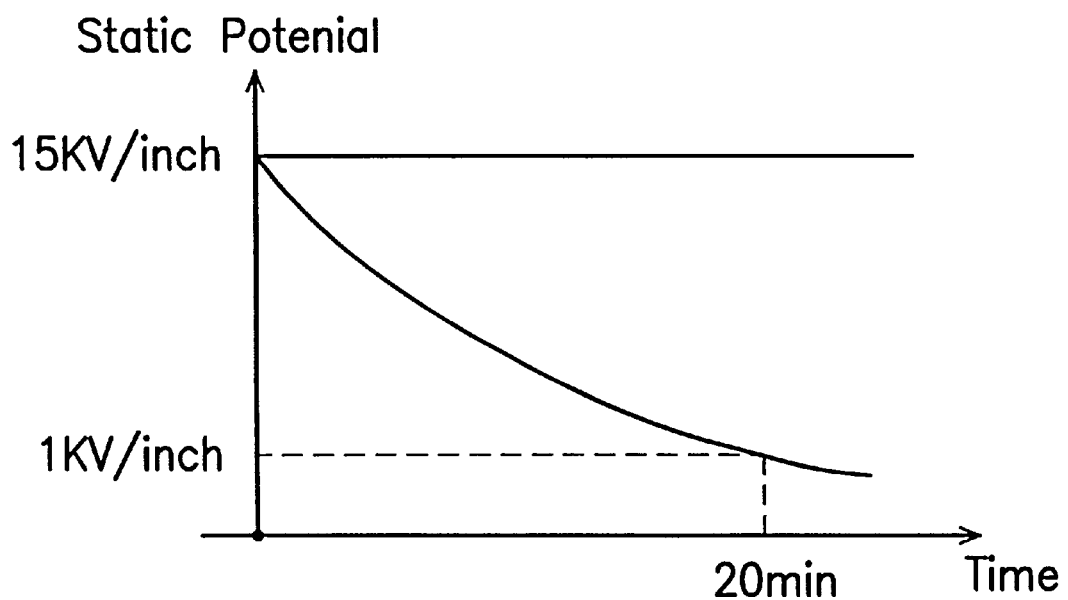
FIG. 5 is a chart showing a relationship of the static potential and the ionizer treatment time.
Figure 6:
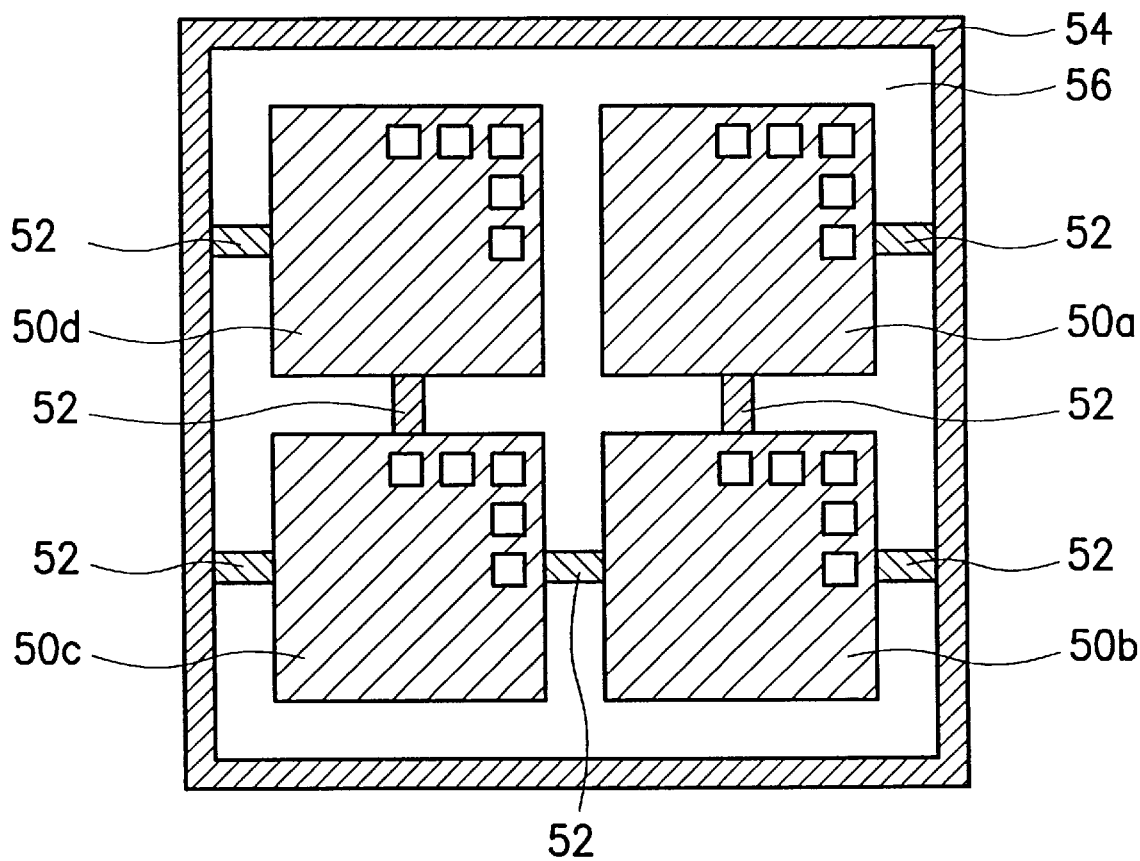
FIG. 6 illustrates, in top view, a modified photomask layout according to a preferred embodiment of the present invention.

FIG. 6 is a top view of a photomask arrangement in accordance with a preferred embodiment of the present invention. Four spaced-apart metal shielding layers, such as chrome films 50a, 50b, 50c, and 50d are formed on a photomask substrate, for example, a glass or quartz plate, so as to provide the desired reticle patterns. Pairs of the metal shielding layers are isolated and surrounded by a clear scribe line 56.

In order to improve the resistivity of electrostatic discharge damage for the reticle patterns (i.e., the metal shielding layers) of the photomask, a plurality of metal lines, such as chrome lines 52 are formed on the clear scribe line 56 to connect adjacent metal shielding layers 50a, 50b, 50c, and 50d. The chrome lines 52 also provide the connection between the metal shielding layers 50a, 50b, 50c, and 50d and a metal frame 54 around the edge of the photomask substrate. In short, the effective surface of the reticle patterns of the photomask is increased. Accordingly, when subjected to an accidental electrostatic discharge, the chrome lines 52 act as paths for spreading the static charge from one of the chrome lines 52 to the other. Our photomask arrangement can thus be free of the electrostatic discharge damage (ESD), for example, peeling of the metal shielding layers 50a, 50b, 50c, and 50d.

In this embodiment, the chrome lines 52 connected to the metal shielding layers 50a, 50b, 50c, and 50d include a bridge-type structure. That is, the chrome lines 52 are formed merely overlying a portion of the clear scribe line 56. Therefore, the other portion of the clear scribe line 56 not shielded by the chrome lines 52 can still be used as an end point for the remaining etching processes.

In order not to affect the pattern transformation process, the width of each of the chrome lines 52 is controlled to be within a range that is less than the minimum resolution of the photolithography process. In an experiment carried out by the inventors, a conventional photomask without the chrome lines 52 and a photomask according to this preferred embodiment, having a plurality of chrome lines 52 with a width smaller than 0.2 μm, were tested in a photolithography process using an I-line stepper. The resulting patterns on respective photoresist layers were identical. This confirms that the pattern transformation of photolithography is not influenced by the thin metal lines 52 between the metal shielding layers 50a, 50b, 50c, and 50d.

Figure 7:
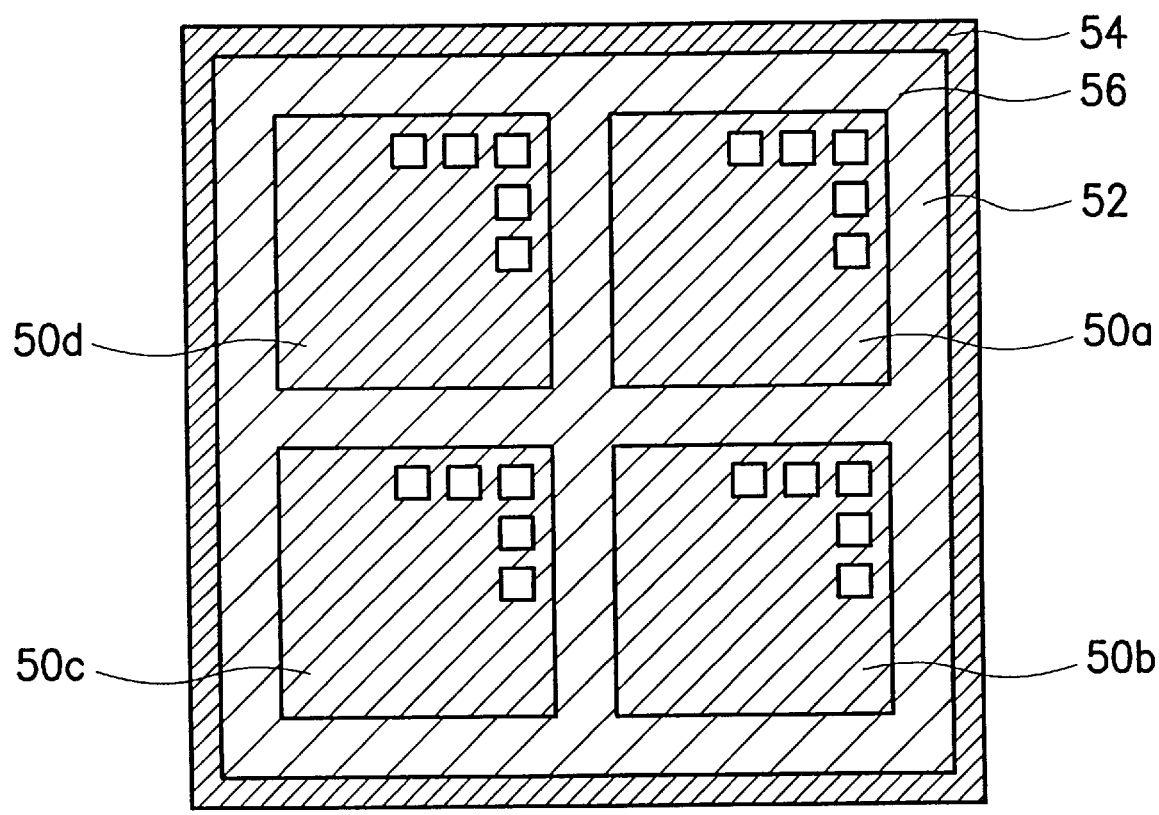
FIG. 7 illustrates, in top view, a modified photomask layout according to another preferred embodiment of the present invention.

FIG. 7 is a top view of a photomask arrangement in accordance with a second preferred embodiment of the present invention. In this embodiment, the metal line 52 is formed overlying the entire area of the clear scribe line 56. With the formation of the metal line 52, the effective surface of the reticle patterns of the photomask is increased. This photomask can thus be free from electrostatic discharged damage. The clear scribe line 56 cannot act as an end point for the etching process since it is totally shielded by the metal line 52. However, any time-mode control technique can still be used instead.

The preparation of a photomask according to the aforementioned embodiments of the invention can be carried out in a batch sequence. That is, the desired reticle patterns (the metal shielding layers 50a, 50b, 50c, and 50d) are formed on a photomask substrate first, and then the metal lines 52 are formed on the clear scribe line 56. Further, the formations of the metal shielding layers 50a, 50b, 50c, and 50d and the metal lines 52 can be performed concurrently without incurring any additional processing step. This is easily done by modifying the reticle pattern of the photomask to include the metal line layout.

While the invention has been described by way of example and in terms of a preferred embodiment, it is to be understood that the invention is not to be limited thereto. On the contrary, it is intended that the invention cover various modifications and similar arrangements within the spirit and scope of the appended claims, which should be accorded the broadest interpretation so as to encompass all such modifications and similar arrangements.

What is claimed is:

1. A photomask having reticle patterns protected from electrostatic discharge damage (ESD), comprising:
   a substrate;
   a plurality of metal shielding layers formed on the surface of said substrate to provide the reticle patterns, wherein pairs of said metal shielding layers are spaced apart by a clear scribe line; and
   a plurality of metal lines formed on said clear scribe line to connect the adjacent metal shielding layers, thereby increasing the effective surface area of the reticle patterns.

2. A photomask according to claim 1, wherein said substrate is made of quartz.

3. A photomask according to claim 1, wherein said metal shielding layers are made of chrome.

4. A photomask according to claim 1, wherein said metal lines are formed overlying a portion of said clear scribe line.

5. A photomask according to claim 1, wherein said metal lines are formed overlying the entire area of said clear scribe line.

6. A photomask according to claim 1, wherein each of said metal lines has a width smaller than 0.2 $\mu$m.

7. A photomask according to claim 1, wherein said metal lines are made of chrome.

* * * * *